United States Patent [19]
Giggins, Jr. et al.

[11] Patent Number: 5,087,477
[45] Date of Patent: Feb. 11, 1992

[54] EB-PVD METHOD FOR APPLYING CERAMIC COATINGS

[75] Inventors: Charles S. Giggins, Jr., Simsbury; Neal P. Anderson, South Windsor; Richard S. Mullin, Pomfret, all of Conn.; Leo A. Riendeau, Springfield, Mass.; Nicholas E. Ulion, Marlborough, Conn.

[73] Assignee: United Technologies Corporation, Hartford, Conn.

[21] Appl. No.: 474,918

[22] Filed: Feb. 5, 1990

[51] Int. Cl.$^5$ .......................... B05D 3/06; B05D 5/12
[52] U.S. Cl. ........................................ 427/38; 427/42; 427/126.3; 427/126.4; 427/255.1; 427/255.2; 427/255.3; 427/255.5; 427/255.7; 427/419.2; 427/419.1; 427/419.7
[58] Field of Search ............. 427/38, 42, 126.3, 126.4, 427/249, 248.1, 255.1, 255.2, 255.3, 255.5, 255.7, 419.2, 419.1, 419.7; 118/726, 719

[56] References Cited

U.S. PATENT DOCUMENTS

| | | | |
|---|---|---|---|
| 3,331,716 | 7/1967 | Bloem et al. | 148/174 |
| 3,506,556 | 2/1968 | Gillery et al. | 204/192 |
| 4,100,310 | 7/1978 | Ura et al. | 427/8 |
| 4,110,893 | 9/1978 | Elam et al. | 29/420.5 |
| 4,223,048 | 9/1980 | Engle, Jr. | 427/39 |
| 4,248,940 | 2/1981 | Goward et al. | 428/633 |
| 4,287,224 | 9/1981 | Heimbach et al. | 427/42 |
| 4,321,311 | 3/1982 | Strangman | 428/623 |
| 4,404,236 | 9/1983 | Komatsu | 427/94 |
| 4,414,249 | 11/1983 | Ulion et al. | 427/248.1 |
| 4,513,026 | 4/1985 | Miyamoto et al. | 427/85 |
| 4,514,437 | 4/1985 | Nath | 427/39 |
| 4,634,605 | 1/1987 | Wiesmann | 427/240 |
| 4,676,994 | 6/1987 | Demaray | 427/42 |
| 4,690,098 | 9/1987 | Mertens et al. | 118/727 |
| 4,880,614 | 11/1989 | Strangman et al. | 428/623 |

OTHER PUBLICATIONS

Silver et al, "As-deposited superconducting Y—B$_a$—C$_u$—O thin films on Si$_1$Al$_2$O$_3$ and SrTiO$_3$ substrates", Appl. Phys. Lett. 52(25) Jun. 1988, pp. 2174–2176.

D. Boone et al.: "Advanced Gas Turbine Coatings For Minimally Processed Coal Derived Liquid Fuels"; Fairbanks et al., editors: Dec. 1979.

R. E. Demaray, J. W. Fairbanks and D. H. Boone: "Physical Vapor Deposition of Ceramic Coatings for Gas Turbine Engine Components"; ASME 1982.

T. E. Strangman: "Thermal Barrier Coatings for Turbine Airfoils", Apr. 1984.

Battelle—Final Report Jan. 1985 "Combustion Zone Durability Program".

S. Shen: Technical Progress Report "Development of Improved Corrosion and Erosion Resistance Coatings for Gas Turbine Airfoils"—Reporting period: Oct. 1, 1979 to Apr. 30, 1980.

S. Shen: Final Progress Report "Development of Improved Corrosion and Erosion Resistance Coatings for Gas Turbine Airfoils"—Reporting period: Sep. 1, 1978 to Sep. 30, 1979.

E. Demaray: "Dedicated Electron Beam Reactive Physical Vapor Deposition (R.P.V.D.) Apparatus for the Production of Ceramic Thermal Barrier Coatings", Project Final Report, Dec. 1981.

Demaray et al., "Development of Electron Beam Physical Vapor Deposition of Ceramic Coatings"; Fairbanks et al. editors; May 1982.

Primary Examiner—Shrive Beck
Assistant Examiner—Roy V. King
Attorney, Agent, or Firm—James M. Rashid

[57] ABSTRACT

A method for applying ceramic coatings using electron beam—physical vapor deposition techniques is described. The method includes the step of introducing the anionic constituent of the ceramic into a coating chamber and confining the anionic constituent about the component to be coated during the coating cycle.

11 Claims, 2 Drawing Sheets

EB-PVD METHOD FOR APPLYING CERAMIC COATINGS

CROSS REFERENCE TO RELATED APPLICATION

This invention is related to the invention described in commonly assigned and copending application Ser. No. 07/389,216, filed on Aug. 3, 1989 by R.S. Mullin et al.

TECHNICAL FIELD

This invention pertains to a method for applying ceramic coatings to metal substrates. More specifically, it relates to the use of electron beam-physical vapor deposition (EB-PVD) techniques adapted for applying ceramic coatings to the surface of a metal component.

BACKGROUND

Ceramic coatings are described in U.S. Pat. Nos. 4,248,940 to Goward et al, 4,321,311 to Strangman and 4,676,994 to Demaray. Exemplary ceramics include zirconia stabilized by magnesia, ceria or yttria. Other types of ceramic coatings are also known, and include, for example, $Al_2O_3$ and MgO, TiN and $Si_3N_4$, and SiC. Ceramic coatings may be used in combination with a metallic coating layer, as discussed in the aforementioned patents, or they may be applied directly to the substrate surface.

Goward applies ceramic coatings by plasma spray techniques, while Strangman and Demaray apply ceramic coatings by EB-PVD techniques. Several investigators have described methods for introducing oxygen into the coating chamber during the EB-PVD of ceramic coatings. See, for example, Demaray et al. in the Proceedings of the Second Conference on Advanced Materials for Alternative Fuel-Capable Heat Engines, Aug. 1981.

While the thermal barrier coatings applied using the aforementioned apparatus and techniques have shown some utility in various industries, further improvements are sought for various applications. The present invention satisfies these needs.

SUMMARY OF THE INVENTION

This invention is an improved method for applying ceramic coatings to a component using EB-PVD techniques. The method includes introducing the anionic constituent of the ceramic into the coating chamber and confining such anionic constituent and evaporant produced by impingement of the electron beam on the ceramic target around the component during the coating process.

The term anionic constituent defines the gaseous species which corresponds to the anion formed when the coating target is evaporated by the electron beam. For example, when the coating target is zirconium oxide, the anions formed are oxygen ions and the anionic constituent is oxygen gas or a compound capable of providing oxygen atoms. Similarly, when the coating target is titanium nitride, the anions are nitrogen ions, and the anionic constituent is nitrogen gas or a compound capable of providing nitrogen atoms.

The invention has particular use in the deposition of ceramic coatings of the type which undergo a reaction to a substoichiometric state when a ceramic target is evaporated in an environment characterized by a low partial pressure of the anionic constituent. An example of such a ceramic is zirconia, which reacts to form the substoichiometric species $ZrO_{2-x}$ during an EB-PVD process in a low pressure chamber.

In one embodiment of the invention, anionic constituent is flowed into the coating chamber and towards the component to be coated through tubes which are in fluid communication with a source of the anionic constituent located outside of the coating chamber. Within the coating chamber is an enclosure which closely surrounds the component to be coated; the enclosure and the component therein are arranged over the coating target. The tubes flow anionic constituent directly into the enclosure which also includes at least one opening through which evaporant, produced by impingement of the electron beam on the ceramic target, is admitted. Evaporant condenses on the component surface; the enclosure confines anionic constituent to the vicinity of the component being coated, and results in the formation of high quality coatings.

The foregoing, and other objects, features and advantages of the present invention will become more apparent in light of the following detailed description of the preferred embodiments as illustrated in the accompanying drawing.

BEST MODE FOR CARRYING OUT THE INVENTION

Figure 1:
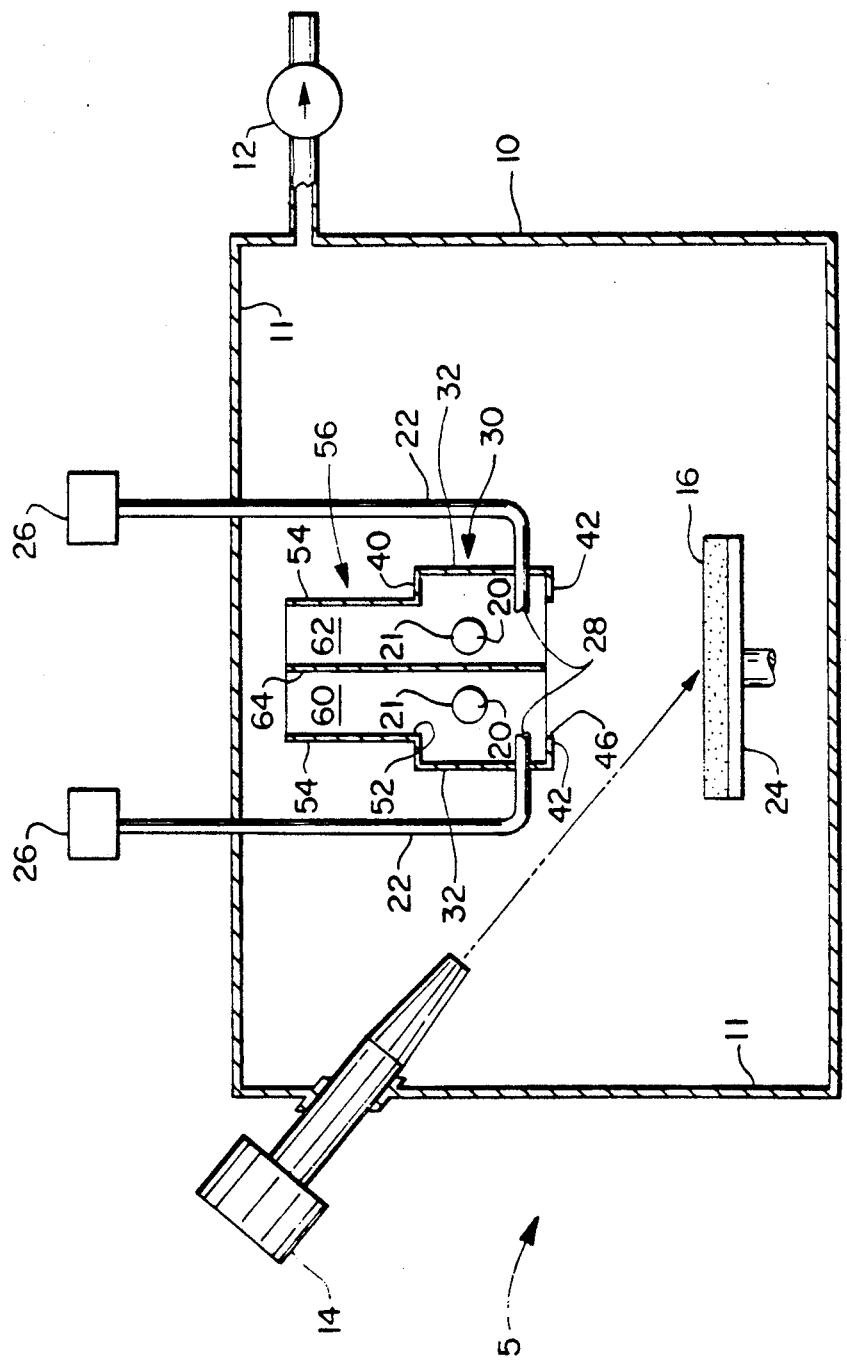
FIG. 1 is a simplified schematic drawing of an electron beam - physical vapor deposition apparatus according to this invention.

Generally speaking, this invention relates to a method for applying high quality ceramic coatings onto the surface of a component.

Such ceramic coatings include, but are not limited to those based on zirconium (e.g., zirconia and oxide stabilized zirconia), magnesium (e.g., magnesia), and cerium (e.g., ceria and oxide stabilized ceria).

The key aspect of this invention relates to a reaction which takes place on the surface of the component to be coated during the EB-PVD process. The reaction results in the formation of stoichiometric (or near stoichiometric) EB-PVD applied columnar grain ceramic coatings having properties not achieved using prior art methods.

Conventional (prior art) methods for applying EB-PVD coatings include the steps of impinging an electron beam onto a coating target within a sealed chamber maintained at a low gas pressure. The target has a composition which corresponds to the desired coating composition. As the beam evaporates the target, a vapor (hereinafter referred to as evaporant) fills the chamber and condenses upon the surface of the component which is suspended within the chamber.

When some coating targets are evaporated using prior art techniques, the evaporant produced is not thermodynamically stable and undergoes a dissociation-type reaction to form the cationic and anionic constituents of the target. An example of one such type of coating target is zirconia ($ZrO_2$), which forms positively charged cations (indicated as $ZrO_{2-x}$) and negatively charged anions (indicated as $O_{2+x}$) when evaporated in a low pressure atmosphere. Coatings which are formed when evaporant comprising separately existing cationic and anionic constituents condenses upon a surface are not always stoichiometric. Such substoichiometric coatings form because an equal number of cations and anions do not condense upon the component surface. This invention describes a method for insuring that stoichiometric coatings are produced during EB-PVD processes.

Coatings are produced according to this invention by continually bathing the surface of the component with the anionic constituent of the target during the coating cycle. The preferred manner in which this is accomplished is by confining the anionic constituent introduced to a space immediately surrounding the component to be coated. Confinement of the anionic constituent is best done using a device within the coating chamber which surrounds the component to be coated. The device (hereinafter referred to as a reaction chamber) is preferably only slightly larger than the component being coated; anionic constituent is flowed into the reaction chamber during the coating cycle, and continually bathes the component surface. As a result, the reaction chamber causes the component to be coated to be surrounded with an atmosphere characterized by a high partial pressure of anionic constituent. As a result of excess anionic being flowed into the reaction chamber, the amount of anion constituent in the chamber is greater than that which is produced by evaporation of the target. Preferably, the amount of anionic constituent in the reaction chamber is four (4) to five (5) times greater than the amount near the coating target.

Evaporant produced by impingement of the electron beam on the coating target also enters the reaction chamber; when such evaporant condenses upon the surface of the component, the coating is formed. And when the anionic constituent collides with the coating, a reaction takes place which satisfies any anionic deficiency in the coating.

The preferred apparatus for carrying out the invention is shown in the Figures.

In particular, FIG. 1 shows an EB-PVD coating apparatus 5 which includes a sealed coating chamber 10 defined by walls 11, and means 12 for evacuating the coating chamber 10. The apparatus 5 further includes an electron beam gun 14, a ceramic target 16, and means for supporting one or more components 20 to be coated within the coating chamber 10. Such apparatus is all of the type conventional in the industry. FIG. 1 shows only one electron beam gun 14, ceramic target 16 and evacuating means 12 for purposes of clarity. It should be understood that more than one each of such components may be used.

The anionic constituent of the ceramic is admitted into the coating chamber 10 through one or more conduits or tubes 22 which extend from a source 26 of such constituent, preferably located outside of the coating chamber 10. Each tube 22 terminates at one or more tube outlet end 28. Each tube 22 is constructed and arranged to flow the anionic constituent through the outlet end 28, and towards the component 20 to be coated. As is seen in the Figure, each outlet end 28 is located between the component 20 and the coating target 16. Anionic constituent flows through each outlet end 28 towards the component 20 in a direction which is concurrent with (i.e., not countercurrent to) the direction that evaporant travels from the coating target 16 to the component 20.

Figure 2:
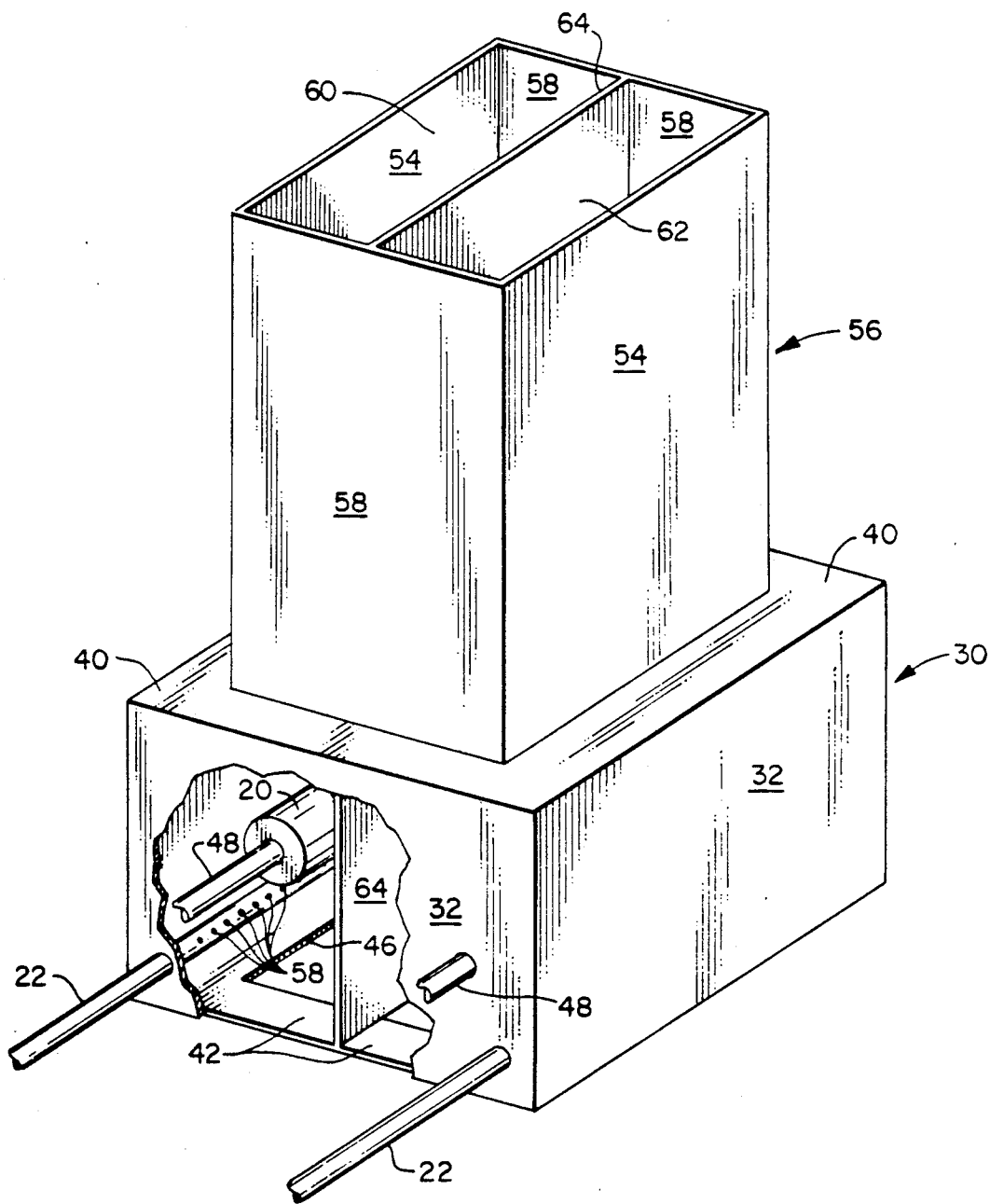
FIG. 2 is a perspective drawing, partly in cross section, showing the preferred reaction chamber of this invention.

As is also shown in FIG. 2, the tubes 22 flow the anionic constituent directly into a reaction chamber 30 which is suspended over the coating target 16 within the coating chamber 10. Each component 20 to be coated is suspended within the reaction chamber 30 in the manner discussed in more detail below. The reaction chamber 30 includes a top wall 40 which is closely spaced from the rearward surface 21 of the component 20 in approximately opposing relation to each tube outlet end 28. (The rearward surface 21 of the component 20 is the surface facing away from the coating target 16.) As is seen in the Figure, the top wall 40 is located between the coating chamber wall 11 and the rearward surface 21 of the component 20. Evaporant produced by impingement of the electron beam on the ceramic target 16 enters the reaction chamber 30 through an opening 46 in a bottom wall 42 which is spaced from the ceramic target 16.

The reaction chamber 30 also includes side walls 32 which, in combination with the top and bottom walls 40 and 42, define an enclosure which surrounds each component 20 to be coated. The dimensions of the reaction chamber 30 are smaller than the dimensions of the coating chamber 10. As a result, the reaction chamber 30 defines an internal volume which is smaller than the internal volume of the coating chamber 10. The top wall 40 has an opening 52 therein to allow some of the anionic constituent flowed into the reaction chamber 30 during the coating operation to exit the reaction chamber 30. The top and bottom openings 46 and 52, respectively, are substantially vertically aligned over the coating target 16.

The purpose of the reaction chamber 30 is, as described above, to confine the anionic constituent to the space immediately surrounding the component to be coated. The reaction chamber 30 creates a high partial pressure of high anionic constituent around the component 20. When evaporant enters the reaction chamber 30 and collides with the component surface, it condenses upon the surface and forms the coating. And when the anionic constituent collides with the condensate, it combines with the condensate in a chemical reaction which fulfills any anionic deficiency in the coating, thereby forming a stoichiometric (or near stoichiometric) coating.

The reaction chamber 30 increases partial pressure of anionic constituent within the chamber, and increases the likelihood that anionic constituent will collide with the condensate. Generally speaking, anionic constituent within the chamber rebounds from one wall of the reaction chamber 30 to another, until it either collides with and reacts with the condensate, or exits the reaction chamber 30 through its openings. The reaction chamber 30 therefore increases the partial pressure of anionic constituent around the component 20 and increases residence time of the anionic constituent around the component 20.

The primary function of the opening 52 in the reaction chamber 30 is to vent anionic constituent from the reaction chamber 30, in a direction which does not intersect or interfere with the electron beam as it impinges upon the coating target 16. The preferred construction of the opening 52 is shown in FIG. 2; walls 54 which extend in a direction away from the coating target 16 are adjacent to the opening 52 and define a chimney-like structure 56.

Means 48 for securing the component to be coated within the reaction chamber 30 are preferably constructed to allow rotation and/or translation of the component about a longitudinal axis or any other axis.

Movement (for example, rotation, translation or tilting) of the component 20 within the reaction chamber 30 during the coating operation promotes the formation of a coating having uniform thickness over the entire component surface.

Tubes 22 for admitting the anionic constituent into the reaction chamber 30 during the coating cycle pass through the reaction chamber wall 32 and are arranged to direct a flow of the anionic constituent towards each component 20 during the coating cycle. Preferably, the tubes 22 are arranged to flow the anionic constituent directly against the component surface. Most preferably, each tube 22 has a plurality of small diameter, closely spaced apertures 58 which flow the anionic constituent towards the component surface at an angle of about 45° to the horizontal. The tubes are oriented at an angle such that the apertures are at least partially shielded from evaporant which enters the reaction chamber 30. This configuration precludes evaporant from condensing in and significantly closing the apertures 58.

If more than one component is to be coated within the reaction chamber 30, the chamber is preferably divided into individual compartments 60 and 62 within which each component to be coated is secured. The compartments 60 and 62 are defined by a divider wall 64 which extends along the length of the reaction chamber 30 between walls 58 approximately parallel to walls 54. The divider 64 increases the amount of surface against which anionic constituent can rebound within the reaction chamber 30.

The invention is particularly useful in the deposition of yttria stabilized zirconia coatings onto components fabricated from nickel base superalloys such as those described in U.S. Pat. No. 4,209,349 to Duhl et al, the contents of which are incorporated by reference. Prior to the application of the coating, the component is coated with a metallic coating which contains, as a minimum, chromium, aluminum, and one or more of the rare earth elements (i.e., those elements of the periodic table from atomic numbers 57 through 71, inclusive, plus yttrium). Preferably, the metal coating is the alloy described in U.S. Pat. No. 32,121 to Gupta et al., the contents of which are incorporated by reference, such alloy contains nickel, cobalt, chromium, aluminum, yttrium, silicon and hafnium. The metallic coating is then peened with glass beads having an average diameter of about 250 microns; the peening intensity is sufficient to create a surface texture in the metallic coating less than about 75 AA (the term "AA" means the arithmetic average of surface roughness in $10^{-6}$ inches, as measured with a profilometer in accordance with ANSI B46-1). Prior to peening, the component is heat treated in a hydrogen atmosphere at about 1080° C. ±15° C. for between 1 and 4 hours, and cooled at a rate equal to or faster than air cool. After peening, the surface of the coated component is cleaned in a conventional wet abrasive grit blasting process. The component is then suspended within a reaction chamber of the type shown in the figures, which is oriented within a conventional EB-PVD coating chamber, also as shown in the figures. The coating chamber is evacuated to a pressure of about $5 \times 10^{-3}$ millibars while an yttria stabilized zirconia target is evaporated by an electron beam. During the evaporation process, commercially pure oxygen gas, as the anionic constituent, is flowed into the reaction chamber at a rate of about 800 standard cubic centimeters per minute.

The reaction chamber and tubes are constructed from an austenitic stainless steel alloy. The tubes have 0.75 millimeter (mm) diameter apertures spaced about 6.5 mm apart along a length of about 10 centimeters (cm) within the chamber. The apertures are oriented at an angle of about 45° to the horizontal, towards the centerline of each specimen to be coated, as shown in the Figure. The top and bottom openings are vertically aligned over the coating target. The component is situated about halfway between the top and bottom walls; the tubes enter the chamber at approximately the same level as the bottom wall.

Components which are coated in accordance with this invention are stoichiometric and have excellent resistance to cyclic oxidation degradation. The metallic bond coating is about 125 to 200 microns thick and the ceramic coating is about 250 to 375 microns thick; the ceramic coating has a columnar grain microstructure which is characteristic of coatings formed in an EB-PVD process.

While the invention has been shown and described with respect to a detailed embodiment, it will be understood by those skilled in the art that various changes in form and detail may be made without departing from the spirit and scope of what is claimed.

We claim:

1. A method for applying a columnar grain ceramic coating to a component, comprising the steps of evaporating a coating target having a composition corresponding to said coating in a coating chamber maintained at reduced gas pressure by impinging an electron beam upon the coating target, wherein evaporant produced by said evaporating step forms cationic and anionic constituents of the target; flowing anionic constituent into a reaction chamber within the coating chamber, wherein the component is disposed within the reaction chamber, said flowing step carried out such that anionic constituent in excess of the anionic constituent produced during said evaporating step is present in the reaction chamber, and confining said anionic constituent about the component within the reaction chamber; and the evaporant upon the surface of the component the anionic constituent with the condensed evaporant the coating.

2. The method of claim 1, further comprising venting the anionic constituent from the reaction chamber to the coating chamber during said condensing step.

3. The method of claim 2, further comprising rotating the component about an axis.

4. The method of claim 3, wherein the coating target is selected from the group consisting of zirconia, magnesia and ceria, and the anionic constituent is oxygen gas.

5. A method for applying a two layer coating to a metal component, comprising the steps of applying a layer of a metal coating which comprises chromium, aluminum, and one or more of the rare earth elements onto the components; and then applying a layer of a ceramic coating to the metal coating layer, wherein the ceramic coating layer is applied by a method which comprises the steps evaporating a coating target having a composition corresponding to said ceramic coating in a coating chamber maintained at reduced gas pressure by impinging an electron beam upon the coating target, wherein evaporant produced by said evaporating step forms cationic and anionic constituents of the target; flowing anionic constituent into a reaction chamber within the coating chamber, wherein the component is disposed within the reaction chamber, said flowing step carried out such that anionic constituent in excess of the constituent produced during said evaporating steps in the reaction chamber, and confining said another constituent about the component within the reaction chamber and condensing the evaporant upon the surface of the component and reacting the anionic constituent with the condensed evaporant to form the coating.

6. The method of claim 5, wherein said metal coating layer is an alloy which consists essentially of nickel, chromium, cobalt, aluminum, yttrium, silicon, and hafnium.

7. The method of claim 6, wherein the ceramic coating target is selected from the group consisting of zirconia, magnesia and ceria.

8. The method of claim 1, wherein during said flowing step, anionic constituent is flowed towards the component in a direction which is concurrent to the direction that evaporant travels toward the component.

9. The method of claim 5, wherein during said flowing step, anionic constituent is flowed towards the component in a direction which is concurrent to the direction that evaporant travels toward the component.

10. The method of claim 1, wherein said flowing step is carried out such that the amount of anionic constituent in the reaction chamber is four to five times greater the amount of anionic constituent near the coating.

11. The method of claim 5, wherein said flowing step is carried out such that the amount of anionic constituent in the reaction chamber is four to five times greater than the amount of anionic constituent near the coating target.

* * * * *

UNITED STATES PATENT AND TRADEMARK OFFICE
CERTIFICATE OF CORRECTION

PATENT NO. : 5,087,477
DATED : February 11, 1992
INVENTOR(S) : Charles S. Giggins, Jr., et. al.

It is certified that error appears in the above-identified patent and that said Letters Patent is hereby corrected as shown below:

Column 6, line 42, insert --condensing-- after "and";
Column 6, line 42 insert -- and reacting --after "component";
Column 6, line 43, insert -- to form-- after "evaporant".
Column 7, line 4, delete "another" and replace it with --anionic--.
Column 8, line 9, insert --than --after "greater".

Signed and Sealed this

Twenty-fifth Day of May, 1993

Attest:

MICHAEL K. KIRK

Attesting Officer

Acting Commissioner of Patents and Trademarks